(12) United States Patent
Ye et al.

(10) Patent No.: US 11,094,540 B2
(45) Date of Patent: Aug. 17, 2021

(54) MANUFACTURING METHOD OF A PAIR OF DIFFERENT CRYSTALLIZED METAL OXIDE LAYERS

(71) Applicant: Au Optronics Corporation, Hsinchu (TW)

(72) Inventors: Jia-Hong Ye, New Taipei (TW); Ching-Liang Huang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 38 days.

(21) Appl. No.: 16/368,891

(22) Filed: Mar. 29, 2019

(65) Prior Publication Data
US 2019/0304779 A1 Oct. 3, 2019

(30) Foreign Application Priority Data
Mar. 29, 2018 (TW) ................. 107111052

(51) Int. Cl.
*H01L 21/02* (2006.01)
*C23C 28/04* (2006.01)
(Continued)

(52) U.S. Cl.
CPC ...... *H01L 21/02565* (2013.01); *C23C 28/046* (2013.01); *H01L 21/022* (2013.01); *H01L 21/0228* (2013.01); *H01L 21/02164* (2013.01); *H01L 21/02532* (2013.01); *H01L 21/02675* (2013.01); *H01L 27/127* (2013.01); *H01L 27/1225* (2013.01); *H01L 27/1229* (2013.01);
(Continued)

(58) Field of Classification Search
CPC ......... H01L 21/02164; H01L 21/02532; H01L 21/02565; H01L 21/02675; H01L 27/1225; H01L 27/1229; H01L 27/127; H01L 27/1285; H01L 29/7869; H01L 21/022; H01L 29/78678; C23C 16/24; C23C 16/402; C23C 16/56; C23C 28/046
See application file for complete search history.

(56) References Cited

U.S. PATENT DOCUMENTS 9,640,556 B2   5/2017  Goto et al.
9,768,203 B2   9/2017  Han et al.
(Continued)

FOREIGN PATENT DOCUMENTS

CN    102856320    6/2015
CN    104900653    9/2015
(Continued)

*Primary Examiner* — Eduardo A Rodela
*Assistant Examiner* — Christopher M Roland
(74) *Attorney, Agent, or Firm* — JCIPRNET

(57) ABSTRACT

A manufacturing method of a crystallized metal oxide layer includes: providing a substrate; forming a first insulation layer on the substrate; forming a first metal oxide layer on the first insulation layer; forming a second metal oxide layer on the first insulation layer; forming a second insulation layer on the first metal oxide layer and the second metal oxide layer; forming a silicon layer on the second insulation layer; performing a first laser process on a portion of the silicon layer covering the first metal oxide layer; and performing a second laser process on a portion of the silicon layer covering the second metal oxide layer. An active device and a manufacturing method thereof are also provided.

12 Claims, 14 Drawing Sheets

(51) Int. Cl.
  *H01L 27/12* (2006.01)
  *C23C 16/24* (2006.01)
  *C23C 16/40* (2006.01)
  *C23C 16/56* (2006.01)
  *H01L 29/786* (2006.01)

(52) U.S. Cl.
  CPC ............ *C23C 16/24* (2013.01); *C23C 16/402* (2013.01); *C23C 16/56* (2013.01); *H01L 29/7869* (2013.01); *H01L 29/78678* (2013.01)

(56) References Cited

U.S. PATENT DOCUMENTS

| | | | |
|---|---|---|---|
| 2010/0085081 A1* | 4/2010 | Ofuji | H01L 27/1233 326/102 |
| 2013/0020569 A1* | 1/2013 | Yamazaki | H01L 27/1225 257/43 |
| 2016/0315104 A1 | 10/2016 | Han et al. | |
| 2016/0329353 A1 | 11/2016 | Goto et al. | |
| 2017/0184893 A1* | 6/2017 | Saitoh | G02F 1/134309 |
| 2017/0256569 A1* | 9/2017 | Ohara | H01L 27/1251 |
| 2017/0309649 A1* | 10/2017 | Hayashi | H01L 29/78696 |
| 2018/0040639 A1* | 2/2018 | Lee | H01L 27/1225 |
| 2018/0158845 A1 | 6/2018 | Liao et al. | |
| 2018/0166474 A1 | 6/2018 | Ye et al. | |
| 2018/0247833 A1* | 8/2018 | Ning | H01L 21/477 |
| 2019/0326440 A1* | 10/2019 | Ye | H01L 29/66969 |

FOREIGN PATENT DOCUMENTS

| | | |
|---|---|---|
| CN | 105917450 | 8/2016 |
| CN | 106409845 | 2/2017 |
| CN | 106783627 | 5/2017 |
| CN | 107170747 | 9/2017 |

\* cited by examiner

MANUFACTURING METHOD OF A PAIR OF DIFFERENT CRYSTALLIZED METAL OXIDE LAYERS

CROSS-REFERENCE TO RELATED APPLICATION

This application claims the priority benefit of Taiwan application serial no. 107111052, filed on Mar. 29, 2018. The entirety of the above-mentioned patent application is hereby incorporated by reference herein and made a part of this specification.

BACKGROUND OF THE INVENTION

Field of the Invention

The invention relates to a crystallized metal oxide layer, and more particularly, to a manufacturing method of a crystallized metal oxide layer, a manufacturing method of an active device substrate, and an active device substrate.

Description of Related Art

In recent years, due to advances in semiconductor manufacturing techniques, the manufacturing process of the thin-film transistor (TFT) tends to be simple and fast. As a result, the TFT is extensively applied in products such as computer chips, mobile phone chips, and liquid crystal displays (LCDs).

In some products having a thin-film transistor, metal oxide is used as a material for the semiconductor channel layer. However, metal oxide formed by a deposition process is often in an amorphous state, and manufacturing issues readily occur. Therefore, a method for solving the above issues is urgently needed.

SUMMARY OF THE INVENTION

The invention provides a manufacturing method of a crystallized metal oxide layer in which an amorphous metal oxide layer can be converted into a crystallized metal oxide layer using laser.

The invention provides a manufacturing method of an active device substrate in which an amorphous metal oxide layer can be converted into a crystallized metal oxide layer using laser.

The invention provides an active device substrate that can alleviate the issue of leakage current.

A manufacturing method of a crystallized metal oxide layer of the invention includes the following. A substrate is provided. A first insulation layer is formed on the substrate. A first metal oxide layer is formed on the first insulation layer. A second metal oxide layer is formed on the first insulation layer. A second insulation layer is formed on the first metal oxide layer and the second metal oxide layer, and the first metal oxide layer and the second metal oxide layer are located between the first insulation layer and the second insulation layer. A silicon layer is formed on the second insulation layer, and the silicon layer covers the first metal oxide layer and the second metal oxide layer. A first laser process is performed on a portion of the silicon layer covering the first metal oxide layer such that the first metal oxide layer is converted into a first crystallized metal oxide layer. A second laser process is performed on a portion of the silicon layer covering the second metal oxide layer such that the second metal oxide layer is converted into a second crystallized metal oxide layer.

A manufacturing method of the active device substrate of the invention includes the following. A crystallized metal oxide layer is formed via the method above. A first gate and a second gate are formed on a substrate. A portion of the silicon layer covering the first crystallized metal oxide layer is removed. A first source, a second source, a first drain, and a second drain are formed, the first source and the first drain are electrically connected to the first crystallized metal oxide layer, and the second source and the second drain are electrically connected to the second crystallized metal oxide layer.

An active device substrate of the invention includes a substrate, a first insulation layer, a second insulation layer, a first active device, a second active device, and a third active device. The substrate has an active region and a peripheral region. The first insulation layer is located on the substrate. The second insulation layer is located on the first insulation layer. The first active device is located on the active region, and the first active device includes a first crystallized metal oxide layer. The second active device is located on the peripheral region. The second active device includes a second crystallized metal oxide layer. The first crystallized metal oxide layer and the second crystallized metal oxide layer are both in contact with the first insulation layer. The third active device is located on the peripheral region and electrically connected to the second active device. The third active device includes a P-type doped silicon semiconductor layer, wherein the second insulation layer is located between the silicon semiconductor layer and the first insulation layer.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1E are cross sections of a manufacturing method of a crystallized metal oxide layer according to an embodiment of the invention.

Referring first to FIG. 1, a substrate 100 is provided. The material of the substrate 100 can be glass, quartz, organic polymer, or an opaque/reflective material (such as conductive material, metal, wafer, ceramic, or other suitable materials), or other suitable materials. If a conductive material or metal is used, then an insulation layer (not shown) is provided on the substrate 100 to prevent short circuits.

A first insulation layer 110 is formed on the substrate 100. The material of the first insulation layer 110 includes, for instance, silicon oxide. In some embodiments, the method of forming the first insulation layer 110 includes chemical vapor deposition (CVD) or other similar processes.

In some embodiments, other conductive layers can be optionally provided between the first insulation layer 110 and the substrate 100, such as metal, semiconductor, or a combination thereof.

Figure 1A:
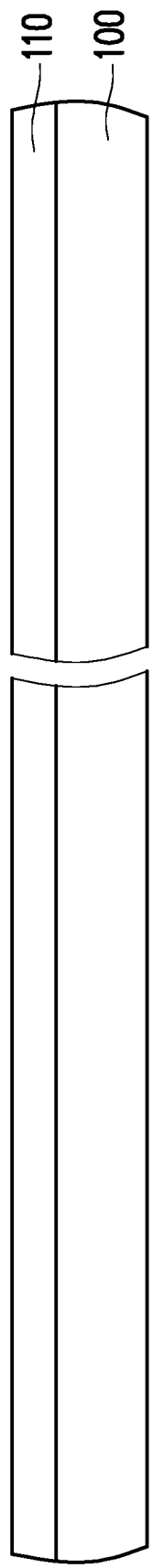
FIG. 1A to FIG. 1E are cross sections of a manufacturing method of a crystallized metal oxide layer according to an embodiment of the invention.
Figure 1B:
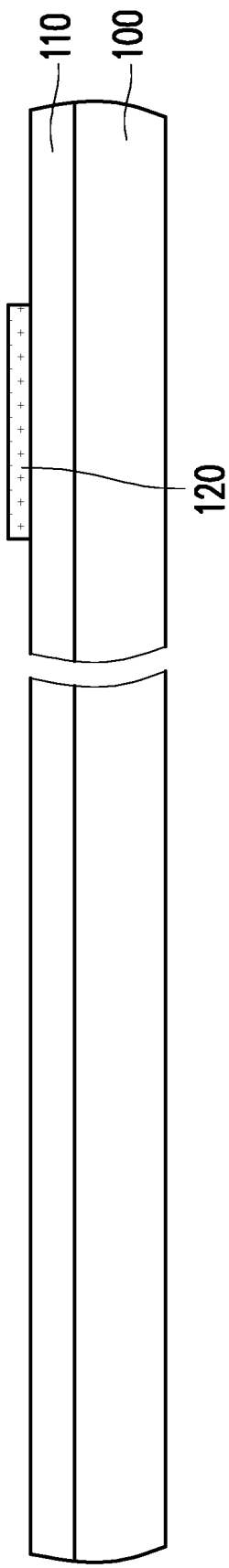

Referring to FIG. 1B, a first metal oxide layer 120 is formed on the first insulation layer 110. In some embodiments, the method of forming the first metal oxide layer 120 includes, for instance, sputtering or other similar processes. In some embodiments, the sputtering process is, for instance, performed at room temperature. The location and shape of the first metal oxide layer 120 are, for instance, defined by a lithography process. The first metal oxide layer 120 includes, for instance, an indium element, gallium element, zinc element, and oxygen element. The first metal oxide layer 120 is, for instance, indium gallium zinc oxide. In some embodiments, the first metal oxide layer 120 includes amorphous metal oxide.

In some embodiments, the thickness of the first insulation layer 110 between the first metal oxide layer 120 and the substrate 100 is preferably 50 nm to 300 nm, such as 100 nm, 150 nm, 200 nm, or 250 nm. Within this thickness range, the first insulation layer 110 can obtain better insulation and heat transfer effect. The thickness of the first metal oxide layer 120 is preferably, for instance, 10 nm to 120 nm, such as 20 nm, 40 nm, 60 nm, 80 nm, or 100 nm.

Figure 1C:
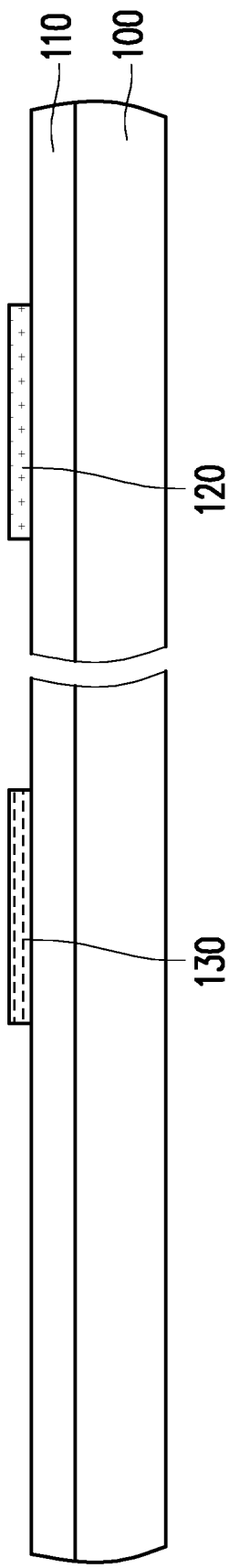

Referring to FIG. 1C, a second metal oxide layer 130 is formed on the first insulation layer 110. In some embodiments, the method of forming the second metal oxide layer 130 includes sputtering or other similar processes. In some embodiments, the sputtering process is, for instance, performed at room temperature. The location and shape of the second metal oxide layer 130 are, for instance, defined by a lithography process. The second metal oxide layer 130 includes, for instance, an indium element, gallium element, tin element, and oxygen element. The second metal oxide layer 130 is, for instance, indium gallium tin oxide. In some embodiments, the second metal oxide layer 130 includes amorphous metal oxide.

In some embodiments, the thickness of the first insulation layer 110 between the second metal oxide layer 130 and the substrate 100 is preferably 50 nm to 300 nm, such as 100 nm, 150 nm, 200 nm, or 250 nm. Within this thickness range, the first insulation layer 110 can obtain better insulation and heat transfer effect. The thickness of the second metal oxide layer 130 is preferably, for instance, 10 nm to 120 nm, such as 20 nm, 40 nm, 60 nm, 80 nm, or 100 nm.

Figure 1D:
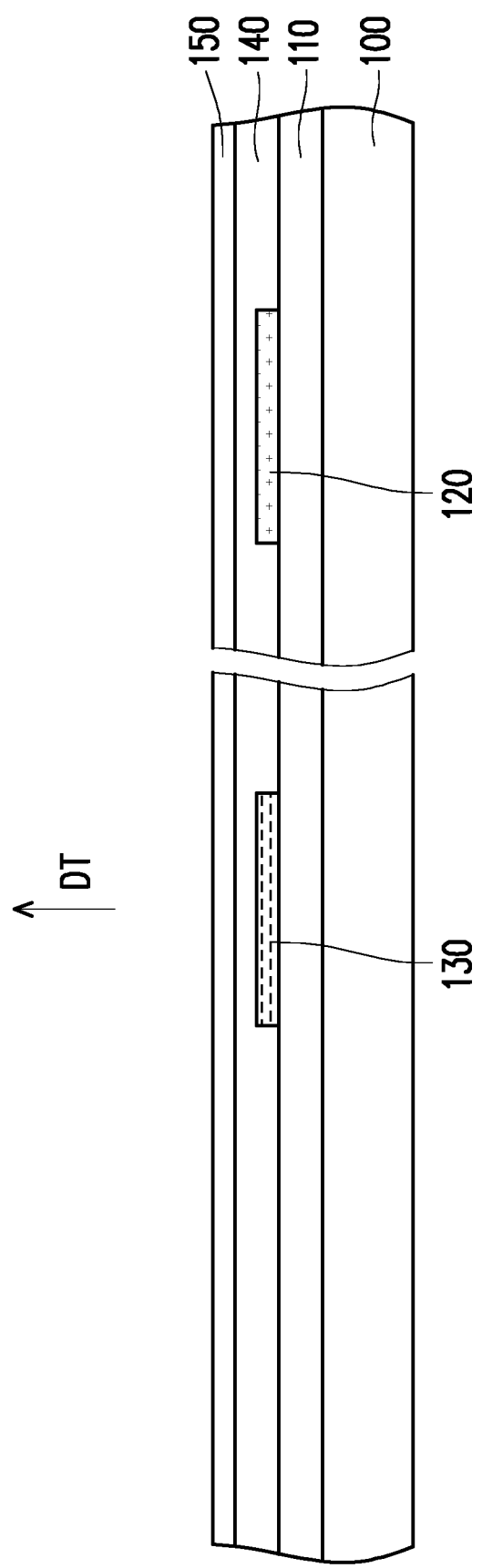

Referring to FIG. 1D, a second insulation layer 140 is formed on the first metal oxide layer 120 and the second metal oxide layer 130. The first metal oxide layer 120 and the second metal oxide layer 130 are located between the first insulation layer 110 and the second insulation layer 140. In the present embodiment, a portion of the second insulation layer 140 is formed on the first insulation layer 110 and in contact with the first insulation layer 110.

The material of the second insulation layer 140 includes, for instance, silicon oxide. In some embodiments, the method of forming the second insulation layer 140 includes chemical vapor deposition (CVD) or other similar processes.

A silicon layer 150 is formed on the second insulation layer 140. The silicon layer 150 covers the first metal oxide layer 120 and the second metal oxide layer 130. The first insulation layer 110, the first metal oxide layer 120, the second insulation layer 140, and the silicon layer 150 are stacked in order in a direction DT perpendicular to the substrate 100. The first insulation layer 110, the second metal oxide layer 130, the second insulation layer 140, and the silicon layer 150 are stacked in order in the direction DT perpendicular to the substrate 100. In some embodiments, the second insulation layer 140 can prevent the silicon layer 150 from peeling off of the first metal oxide layer 120 and the second metal oxide layer 130.

The thickness of the silicon layer 150 is preferably 40 nm to 60 nm, such as 50 nm. In some embodiments, the method of forming the silicon layer 150 includes CVD or other similar processes. In some embodiments, the silicon layer 150 includes amorphous silicon.

Figure 1E:
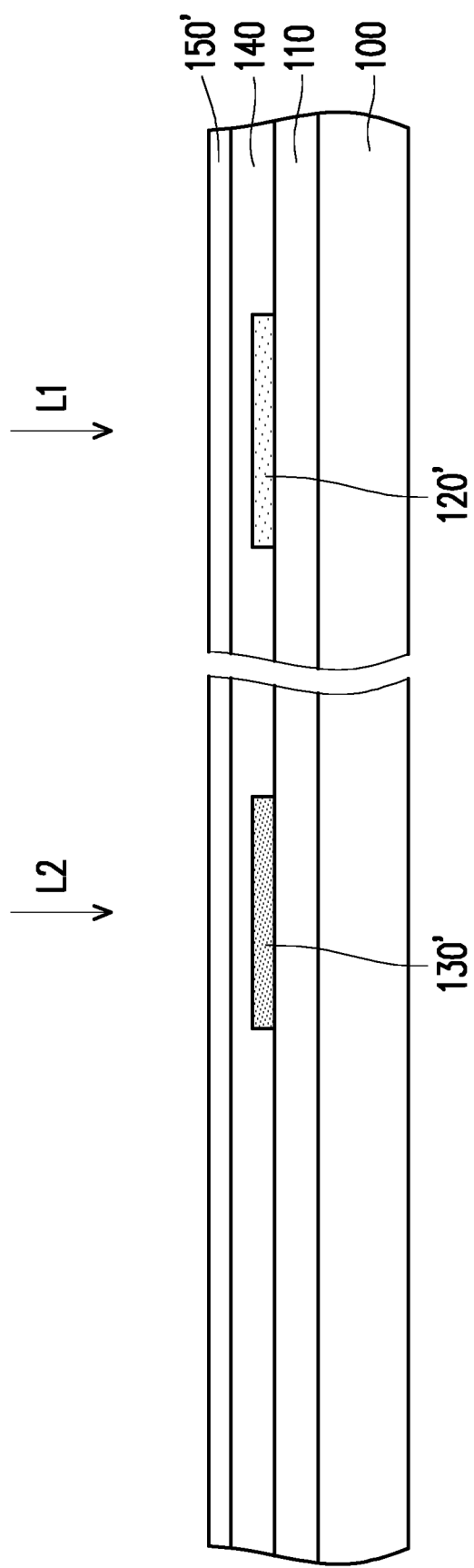

Referring to FIG. 1E, a first laser process L1 is performed on a portion of the silicon layer 150 covering the first metal oxide layer 120 to convert the first metal oxide layer 120 into a first crystallized metal oxide layer 120'. In some embodiments, the energy of the first laser process L1 is 70 mJ/cm$^2$ to 500 mJ/cm$^2$, such as 100 mJ/cm$^2$, 150 mJ/cm$^2$, 160 mJ/cm$^2$, 200 mJ/cm$^2$, 250 mJ/cm$^2$, 300 mJ/cm$^2$, 350 mJ/cm$^2$, 400 mJ/cm$^2$, or 450 mJ/cm$^2$. In some embodiments, the first crystallized metal oxide layer 120' includes an indium element, gallium element, zinc element, and oxygen element, and the first crystallized metal oxide layer 120' is, for instance, indium gallium zinc oxide.

A second laser process L2 is performed on a portion of the silicon layer 150 covering the second metal oxide layer 130 to convert the second metal oxide layer 130 into a second crystallized metal oxide layer 130'. In some embodiments, the energy of the second laser process L2 is 70 mJ/cm$^2$ to 500 mJ/cm$^2$, such as 100 mJ/cm$^2$, 150 mJ/cm$^2$, 160 mJ/cm$^2$, 200 mJ/cm$^2$, 250 mJ/cm$^2$, 300 mJ/cm$^2$, 350 mJ/cm$^2$, 400 mJ/cm$^2$, or 450 mJ/cm$^2$. In some embodiments, the second crystallized metal oxide layer 130' includes an indium element, gallium element, tin element, and oxygen element, and the second crystallized metal oxide layer 130' is, for instance, indium gallium tin oxide.

In the present embodiment, the first metal oxide layer 120 and the second metal oxide layer 130 are both clamped between the first insulation layer 110 and the second insulation layer 140, and therefore the energy needed for the first laser process L1 and the second laser process L2 can be reduced.

After the first laser process L1 and the second laser process L2 are performed, the silicon layer 150 is converted into a silicon layer 150', and in some embodiments, a portion of the silicon layer 150' contains polycrystalline silicon, but the invention is not limited thereto. In some embodiments, the silicon layer 150' does not contain polycrystalline silicon, and the silicon layer 150 and the silicon layer 150' both contain amorphous silicon.

In some embodiments, the laser used in the first laser process L1 and the second laser process L2 is excimer laser, blue laser, or green laser, and the adopted wavelength is close to the absorption wavelength of amorphous silicon such that the silicon layer 150 can be more effectively heated. The absorption wavelength of the silicon layer 150 is about 350 nm to 750 nm. In some embodiments, excimer laser is adopted to irradiate the silicon layer 150, that is, an excimer laser annealing (ELA) technique is used to process amorphous silicon. In some embodiments, before the silicon layer 150 is irradiated with laser, rapid thermal processing (RTP) is further used to process the silicon layer 150 to prevent the occurrence of hydrogen explosion.

Based on the above, the first metal oxide layer 120 and the second metal oxide layer 130 are crystallized using a laser process, and the temperature is low in comparison to the temperature needed for a regular high-temperature furnace annealing process. Since the first metal oxide layer 120 and the second metal oxide layer 130 do not need to be crystallized in a high-temperature furnace annealing manner, each layer on the substrate 100 is less readily peeled off due to coefficient of thermal expansion mismatch. Moreover, the crystallization of the first metal oxide layer 130 and the second metal oxide layer 150 using a laser process has a lower temperature than an excimer laser annealing process in a regular high-temperature annealing process.

Figure 2:
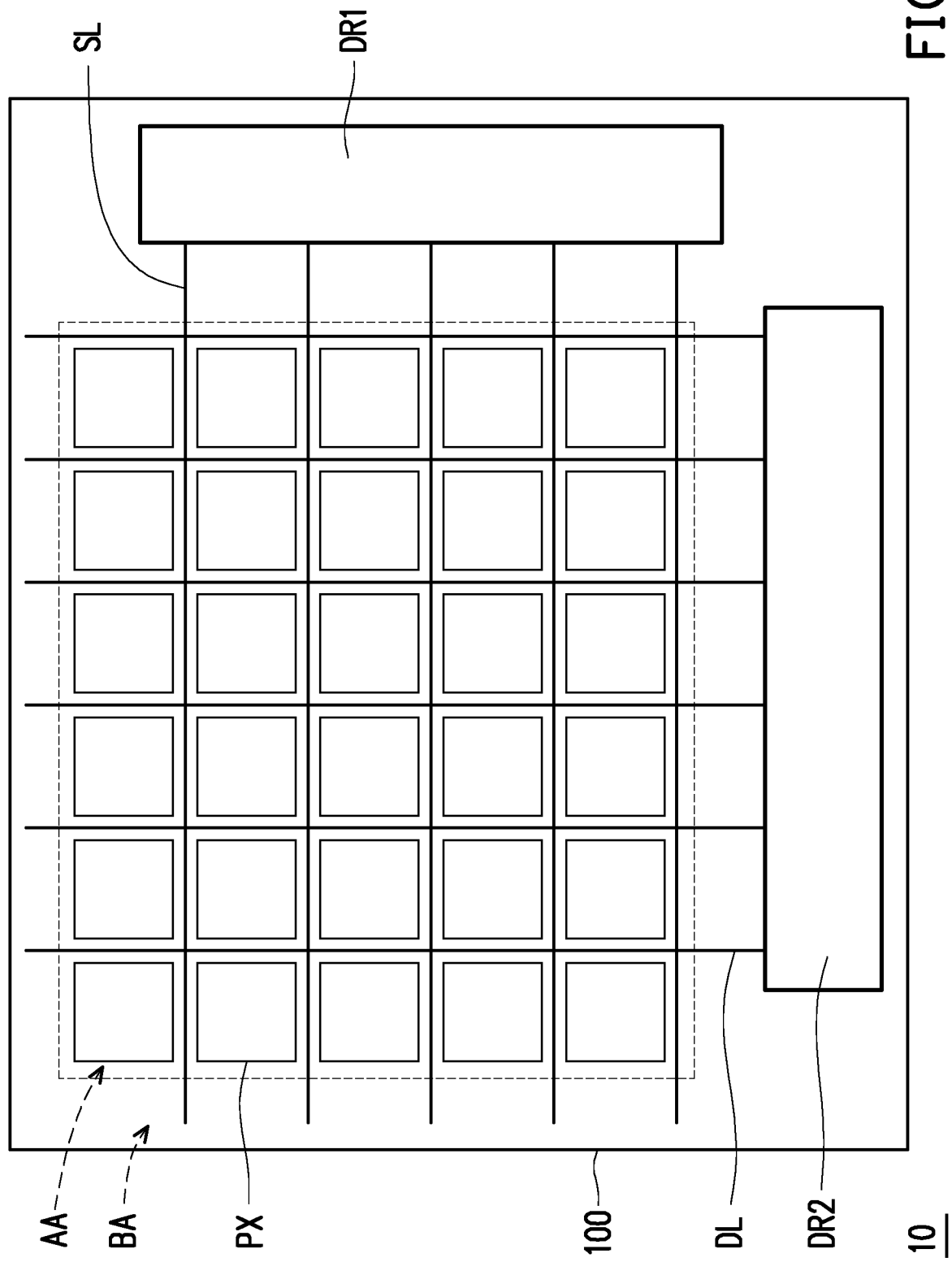
FIG. 2 is a top view of an active device substrate according to an embodiment of the invention.

FIG. 2 is a top view of an active device substrate according to an embodiment of the invention. It should be mentioned here that, the embodiment of FIG. 2 adopts the reference numerals of the embodiment of FIG. 1A to FIG. 1E and a portion of the contents thereof, wherein the same or similar numerals are used to represent the same or similar devices and descriptions of the same technical contents are omitted. The omitted portions are as described in the above embodiments and are not repeated herein.

Referring to FIG. 2, the active device substrate 10 includes a substrate 100, a peripheral circuit DR1, a peripheral circuit DR2, a scan line SL, a data line DL, and a pixel structure PX.

The substrate 100 has an active region AA and a peripheral region BA. The peripheral circuit DR1 and the peripheral circuit DR2 are located on the peripheral region BA. The scan line SL, the data line DL, and the pixel structure PX are located on the active region AA. The scan line SL and the data line DL are respectively extended onto the active region AA from the peripheral circuit DR1 and the peripheral circuit DR2. Each of the pixel structures PX is electrically connected to at least one scan line SL. Each of the pixel structures PX is electrically connected to at least one data line DL.

FIG. 3A to FIG. 3E are cross sections of a manufacturing method of an active device substrate according to an embodiment of the invention. It should be mentioned here that, the embodiment of FIG. 3A to FIG. 3E adopts the reference numerals of the embodiment of FIG. 2 and a portion of the contents thereof, wherein the same or similar numerals are used to represent the same or similar devices and descriptions of the same technical contents are omitted. The omitted portions are as described in the above embodiments and are not repeated herein.

Figure 3A:
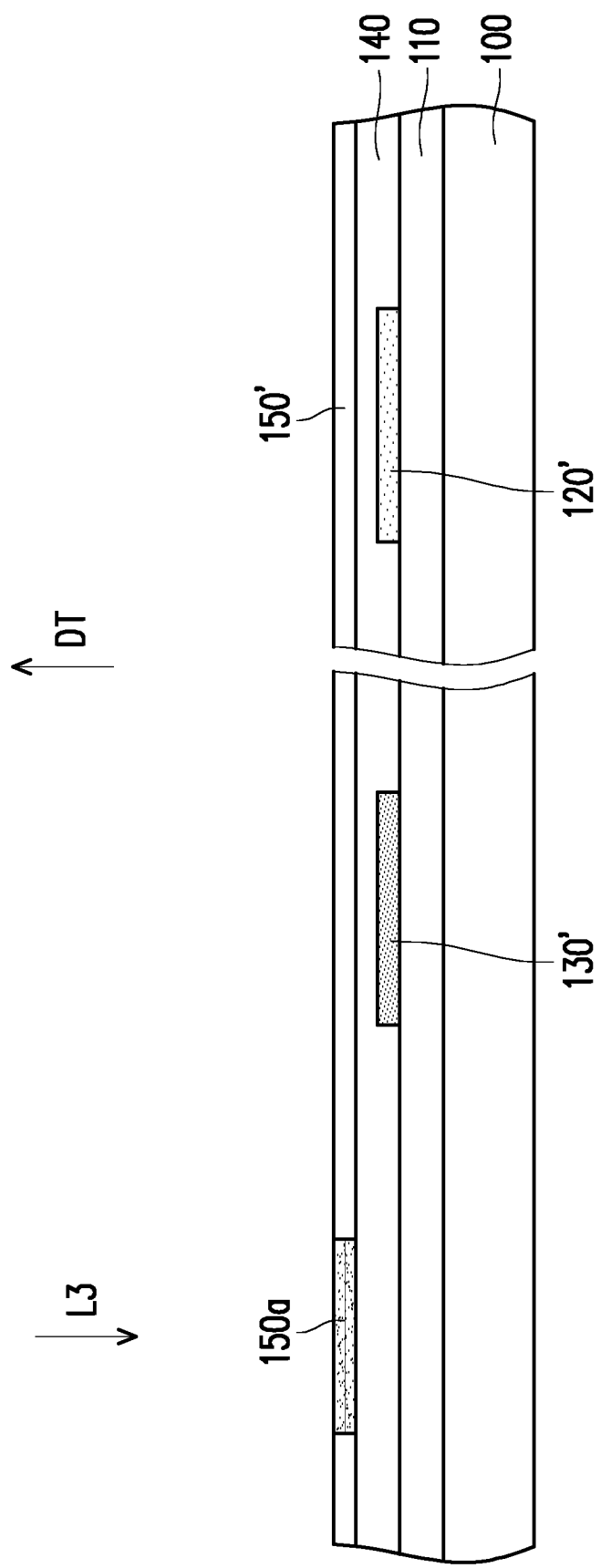
FIG. 3A to FIG. 3E are cross sections of a manufacturing method of an active device substrate according to an embodiment of the invention.

FIG. 3A is, for instance, a subsequent process to FIG. 1E. Referring to FIG. 3A, a silicon layer 150' includes amorphous silicon, and a third laser process L3 is performed on the silicon layer 150' to form a silicon layer 150a including polycrystalline silicon. The silicon layer 150a, the first crystallized metal oxide layer 120', and the second crystallized metal oxide layer 130' are not overlapped in the direction DT perpendicular to the substrate 100.

Figure 3B:
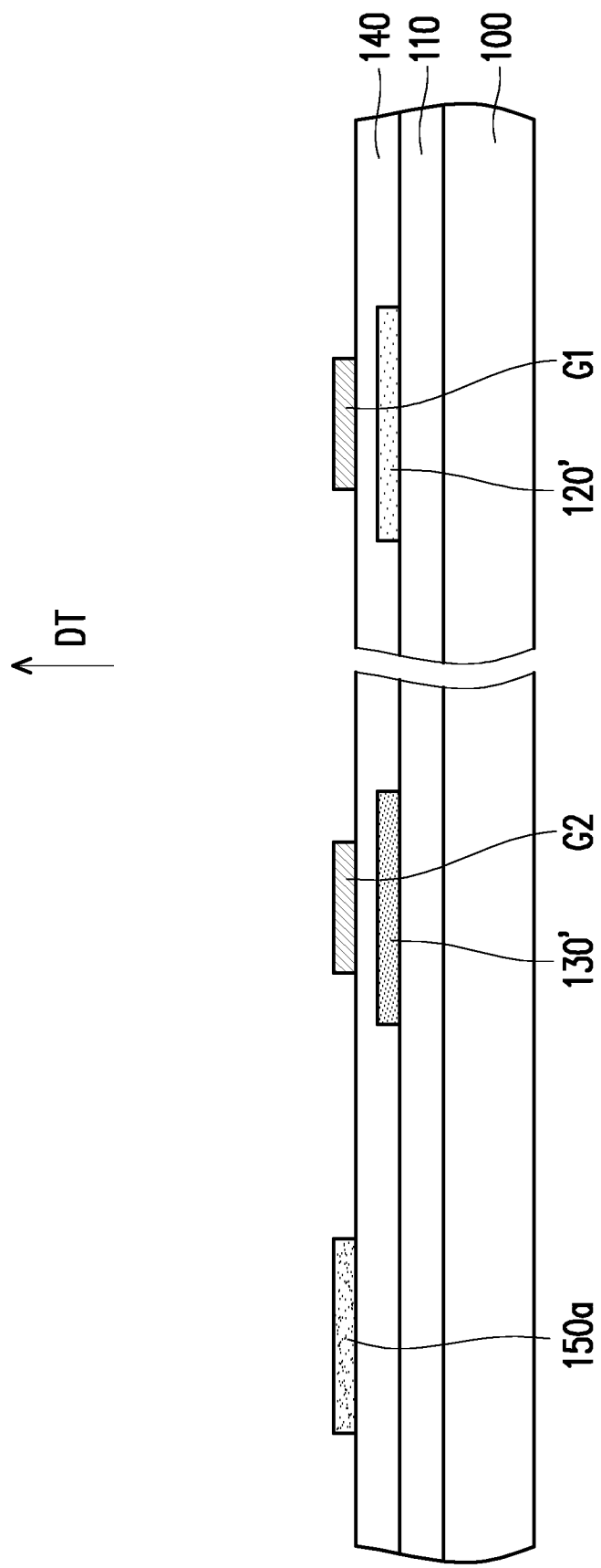

Referring to FIG. 3B, a portion of the silicon layer 150' covering the first crystallized metal oxide layer 120' is removed. A portion of the silicon layer 150' covering the second crystallized metal oxide layer 130' is removed. In some embodiments, all of the remaining silicon layer 150' is removed to only leave the silicon layer 150a.

A first gate G1 and a second gate G2 are formed on the substrate 100, and the first gate G1 and the second gate G2 are separated from each other. The material of the first gate G1 and the second gate G2 includes, for instance, silver, aluminum, copper, molybdenum, titanium, gold, other conductive materials, or a combination of the conductive materials. The first gate G1 and the second gate G2 are, for instance, formed at the same time, and the forming method of the first gate G1 and the second gate G2 includes, for instance, a deposition process, lithography process, and other suitable processes. In some embodiments, the first gate G1 is, for instance, electrically connected to the scan line SL (shown in FIG. 2). In some embodiments, the first gate G1, the second gate G2, and the scan line SL are formed in the same process.

In the present embodiment, the second insulation layer 140 is located between the first gate G1 and the first crystallized metal oxide layer 120' and between the second gate G2 and the second crystallized metal oxide layer 130'. The first gate G1 and the first crystallized metal oxide layer 120' are overlapped in the direction DT perpendicular to the substrate 100, and the second gate G2 and the second crystallized metal oxide layer 130' are overlapped in the direction DT perpendicular to the substrate 100.

Figure 3C:
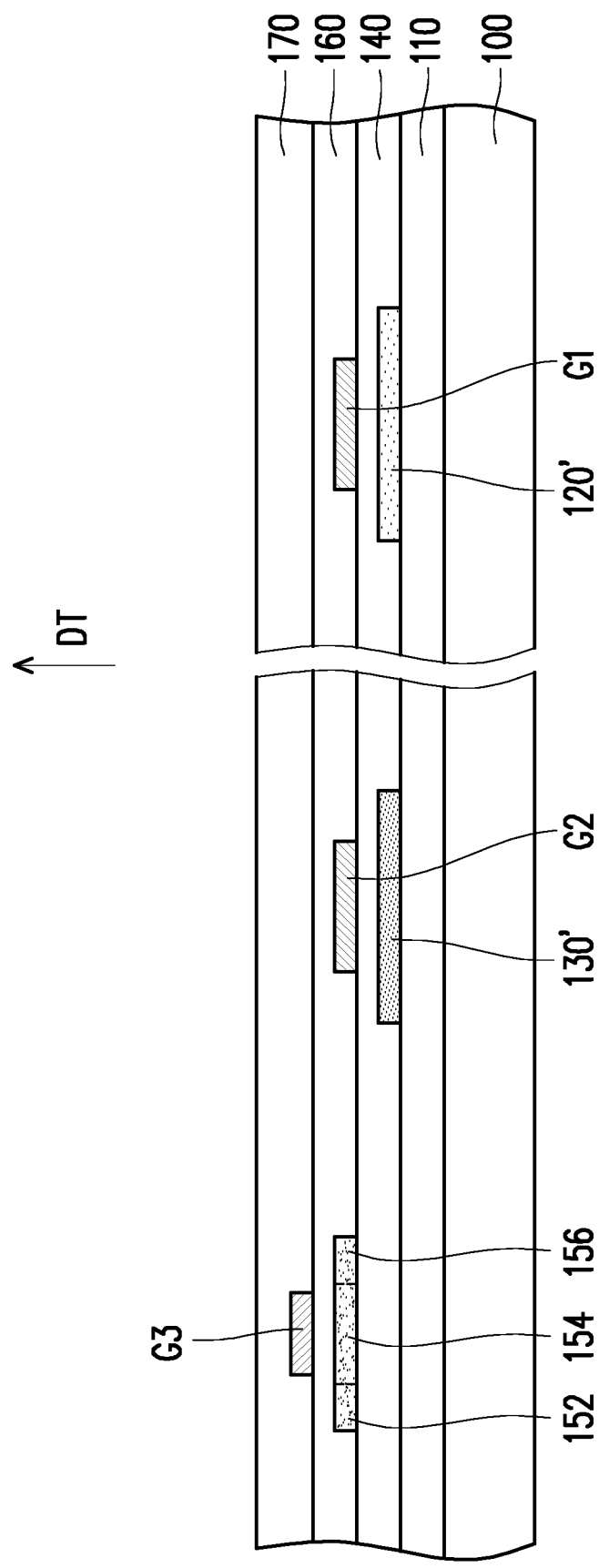

Referring to both FIG. 3B and FIG. 3C, a third insulation layer 160 is formed on the first gate G1, the second gate G2, the silicon layer 150a, and the second insulation layer 140. The material of the third insulation layer 160 includes, for instance, silicon oxide, silicon nitride, silicon oxynitride, a polymer material, or other suitable materials. The method of forming the third insulation layer 160 includes, for instance, CVD, coating, or other similar processes.

A third gate G3 is formed on the third insulation layer 160, and the third gate G3 and the silicon layer 150a are overlapped in the direction DT perpendicular to the substrate 100. The material of the third gate G3 includes, for instance, silver, aluminum, copper, molybdenum, titanium, gold, other conductive materials, or a combination of the conductive materials. The forming method of the third gate G3 includes, for instance, a deposition process, lithography process, and other suitable processes. In the present embodiment, although the first gate G1 and the second gate G2 are formed on the second insulation layer 140 and located between the second insulation layer 140 and the third insulation layer 160, the invention is not limited thereto. In other embodiments, the first gate G1 and the second gate G2 are both formed on the third insulation layer 160.

A fourth insulation layer 170 is formed on the third gate G3 and the third insulation layer 160. The material of the fourth insulation layer 170 includes, for instance, silicon oxide, silicon nitride, silicon oxynitride, a polymer material, or other suitable materials. The method of forming the fourth insulation layer 170 includes, for instance, CVD, coating, or other similar processes.

A doping process is performed on the silicon layer 150a to form a silicon semiconductor layer 150b. The doped silicon semiconductor layer 150b includes a source region 152, a channel region 154, and a drain region 156, and the channel region 154 is located between the source region 152 and the drain region 156. The source region 152 and the drain region 156 include, for instance, a P-type semiconductor. In the present embodiment, the doping process performed on the silicon semiconductor layer 150b is performed after the third gate G3 is formed. For instance, the doping process is performed on the silicon layer 150a with the third insulation layer 160 in between, but the invention is not limited thereto. In other embodiments, the doping process can also be performed before the third gate G3 is formed. For instance, a photomask is formed on the silicon layer 150a, and then a doping process is performed on the silicon layer 150a.

Figure 3D:
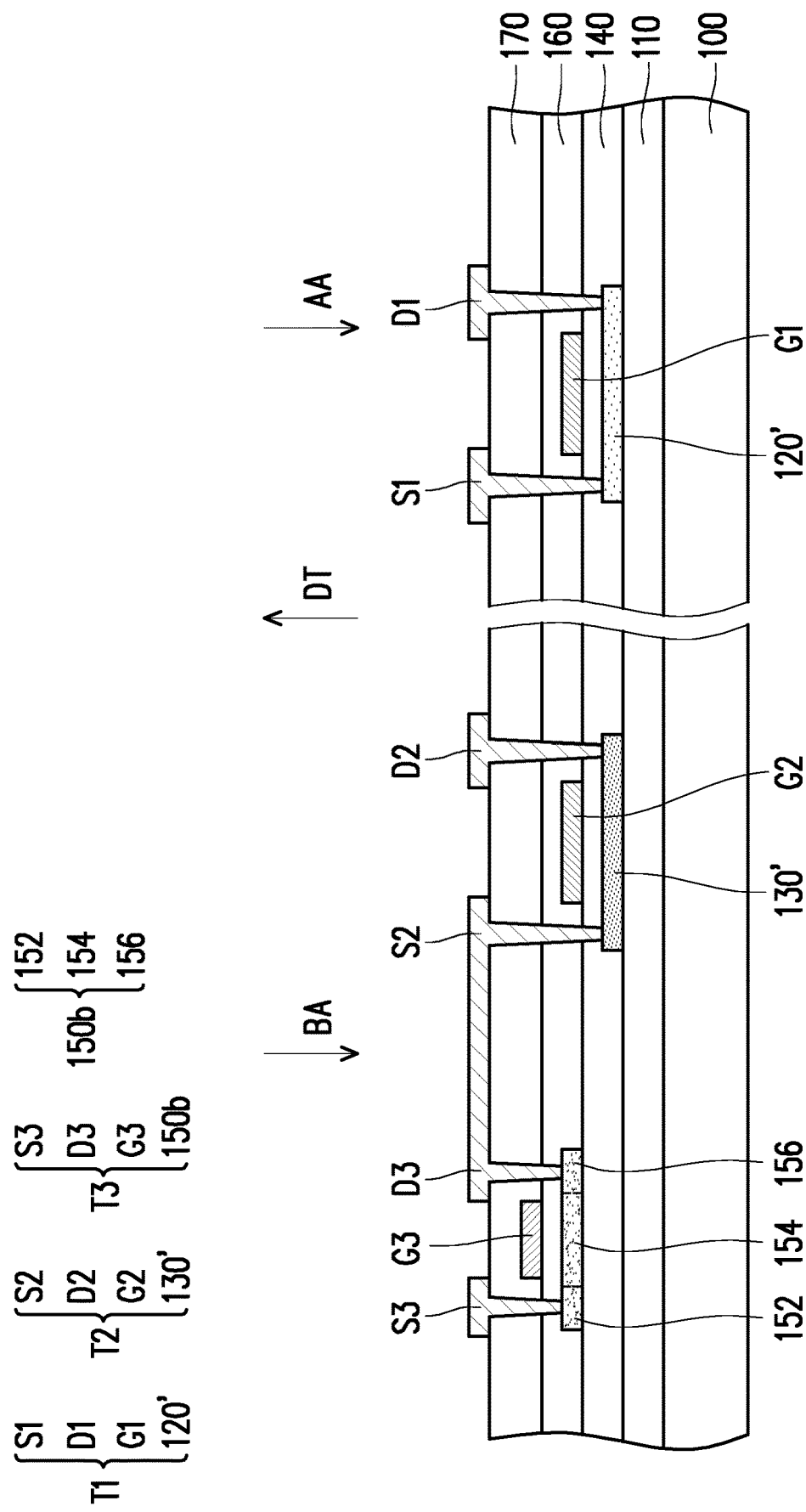

Referring to FIG. 3C and FIG. 3D, a plurality of openings is formed in the second insulation layer 140, the third insulation layer 160, and the fourth insulation layer 170. The first source S1, the first drain D1, the second source S2, the second drain D2, the third source S3, and the third drain D3 are formed on the fourth insulation layer 170. The first source S1, the first drain D1, the second source S2, the second drain D2, the third source S3, and the third drain D3 are respectively filled in the corresponding openings. The first source S1 and the first drain D1 are electrically connected to the first crystallized metal oxide layer 120'. The second source S2 and the second drain D2 are electrically connected to the second crystallized metal oxide layer 130'. The third source S3 and the third drain D3 are respectively electrically connected to the source region 152 and the drain region 156 of the silicon semiconductor layer 150b. At this point, the first active device T1, the second active device T2, and the third active device T3 are largely complete. In the present embodiment, the first active device T1, the second active device T2, and the third active device T3 all include a top gate active device, but the invention is not limited thereto. In other embodiments, the first active device T1, the second active device T2, and the third active device T3 can also be bottom gate active devices.

The second active device T2 and the third active device T3 are, for instance, located on the peripheral region BA (shown in FIG. 2) of the substrate 100. The second active device T2 and the third active device T3 are, for instance, a portion of the peripheral circuit DR1 (shown in FIG. 2) or the peripheral circuit DR2 (shown in FIG. 2), and can be used as, for instance, the active devices in a multiplexer, driver circuit, or other electronic devices. The first active device T1 is, for instance, located on the active region AA (shown in FIG. 2) of the substrate 100. The first active device T1 is, for instance (shown in FIG. 2), a portion of the pixel structure PX.

In some embodiments, the first source S1 of the first active device T1 is electrically connected to the data line DL (shown in FIG. 2). In some embodiments, the first source S1, the first drain D1, the second source S2, the second drain D2, the third source S3, the third drain D3, and the data line DL are formed in the same process.

In some embodiments, one of the third source S3 and the third drain D3 of the third active device T3 is electrically connected to one of the second source S2 and the second drain D2 of the second active device T2. The third source S3 or the third drain D3 of the third active device T3 is electrically connected to the second crystallized metal oxide layer 130' of the second active device T2. The invention is not limited to the third drain D3 being electrically connected to the second source S2.

In some embodiments, the second crystallized metal oxide layer 130' is an intrinsic semiconductor, and has free electrons as carriers without requiring a doping process (for instance, electrons are transferred by oxygen vacancies). Therefore, the third active device T3 having a P-type conductivity channel layer and the second active device T2 having an N-type conductivity channel layer can be combined into a complementary metal-oxide-semiconductor (CMOS). The beneficial effect of power saving can be obtained without an additional N-type doping process.

Figure 3E:
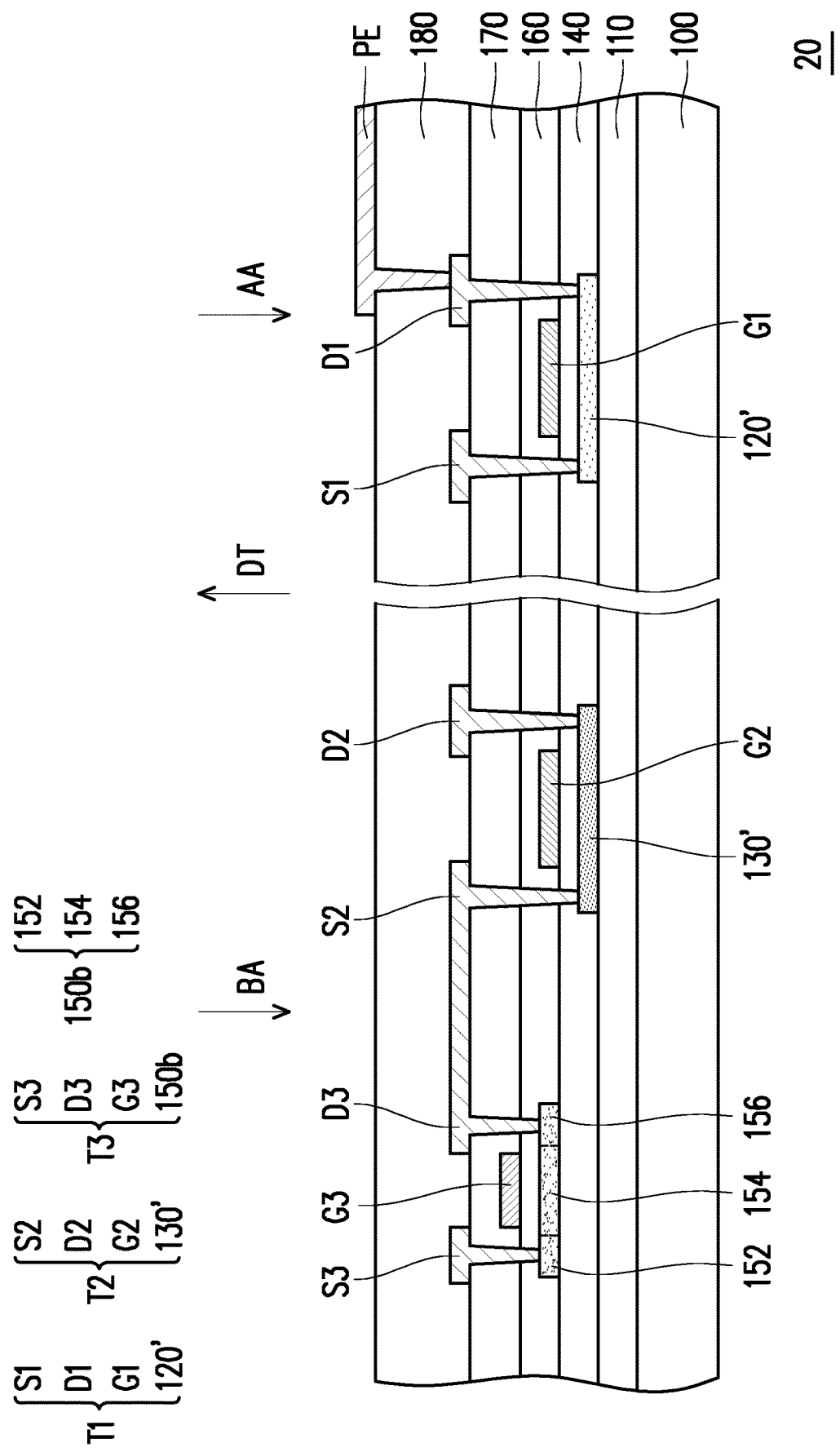

Referring to FIG. 3E, a planarization layer electrode formed on the first source S1, the first drain D1, the second source S2, the second drain D2, the third source S3, and the third drain D3. The planarization layer 180 is at least located on the active region AA of the substrate 100. A pixel electrode PE is formed on the planarization layer 180. The planarization layer 180 has a plurality of openings, and the pixel electrode PE is filled in the openings of the planarization layer 180 and electrically connected to the first drain D1.

In the present embodiment, an active device substrate 20 includes a substrate 100, a first insulation layer 110, a second insulation layer 140, a first active device T1, a second active device T2, and a third active device T3. The substrate 100 has an active region AA and a peripheral region BA. The first insulation layer 110 is located on the substrate 100. The second insulation layer 140 is located on the first insulation layer 110. The first active device T1 is located on the active region AA, and the first active device T1 includes a first crystallized metal oxide layer 120'. The second active device T2 is located on the peripheral region BA. The second active device T2 includes a second crystallized metal oxide layer 130'. The first crystallized metal oxide layer 120' and the second crystallized metal oxide layer 130' are both in contact with the first insulation layer 110. The third active device T3 is located on the peripheral region BA and electrically connected to the second active device T2. The third active device T3 includes a P-type doped silicon semiconductor layer 150b, wherein the second insulation layer 140 is located between the silicon semiconductor layer 150b and the first insulation layer 110.

In the present embodiment, the first crystallized metal oxide layer 120' of the first active device T1 is, for instance, indium gallium zinc oxide, and therefore the pixel structure PX (shown in FIG. 2) can have the properties of low frame rate and low Ioff.

In the present embodiment, the second crystallized metal oxide layer 130' of the second active device T2 is, for instance, indium gallium zinc oxide or indium gallium tin oxide, and can be combined with the third active device T3 containing the P-type doped silicon semiconductor layer 150b into a CMOS to increase the current efficiency of the active device substrate.

Figure 4:
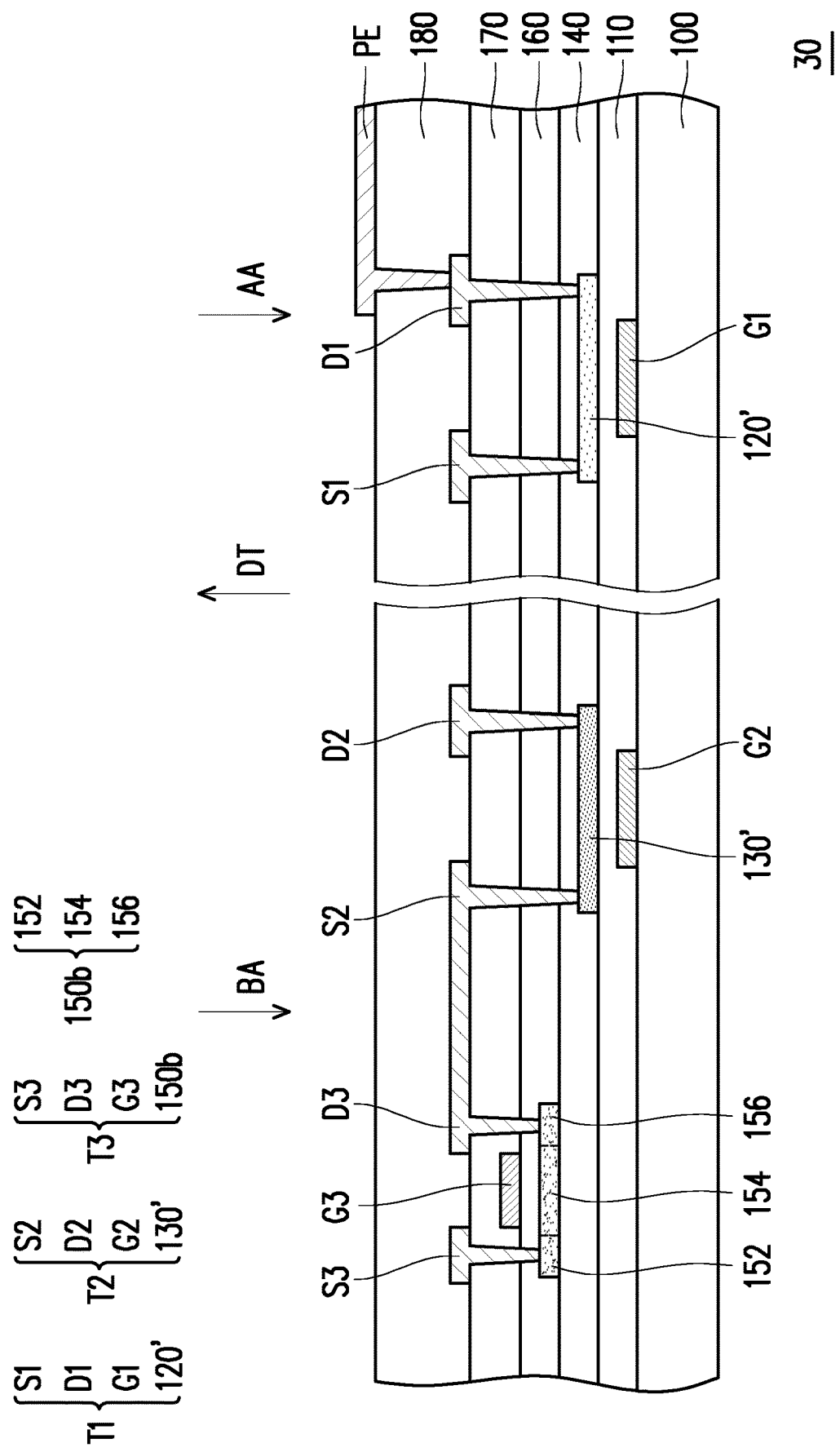
FIG. 4 is a cross section of an active device substrate according to an embodiment of the invention.

FIG. 4 is a cross section of an active device substrate according to an embodiment of the invention. It should be mentioned here that, the embodiment of FIG. 4 adopts the reference numerals of the embodiment of FIG. 3A to FIG. 3E and a portion of the contents thereof, wherein the same or similar numerals are used to represent the same or similar devices and descriptions of the same technical contents are omitted. The omitted portions are as described in the above embodiments and are not repeated herein.

The difference between an active device substrate 30 of the embodiment of FIG. 4 and the active device substrate 20 of the embodiment of FIG. 3E is that in the active device substrate 30, the first gate G1 and the second gate G2 are formed on the substrate 100 before the first insulation layer 110 is formed on the substrate 100.

The first gate G1 and the first crystallized metal oxide layer 120' are overlapped in the direction DT perpendicular to the substrate 100, and the second gate G2 and the second crystallized metal oxide layer 130' are overlapped in the direction DT perpendicular to the substrate 100. In the present embodiment, the first active device T1 and the second active device T2 include a bottom gate active device.

In some embodiments, the first gate G1 and the second gate G2 located below the first crystallized metal oxide layer 120' and the second crystallized metal oxide layer 130' have good heat conduction function, and the crystal quality of the first crystallized metal oxide layer 120' and the second crystallized metal oxide layer 130' can be increased when the first laser process and the second laser process are performed.

Figure 5:
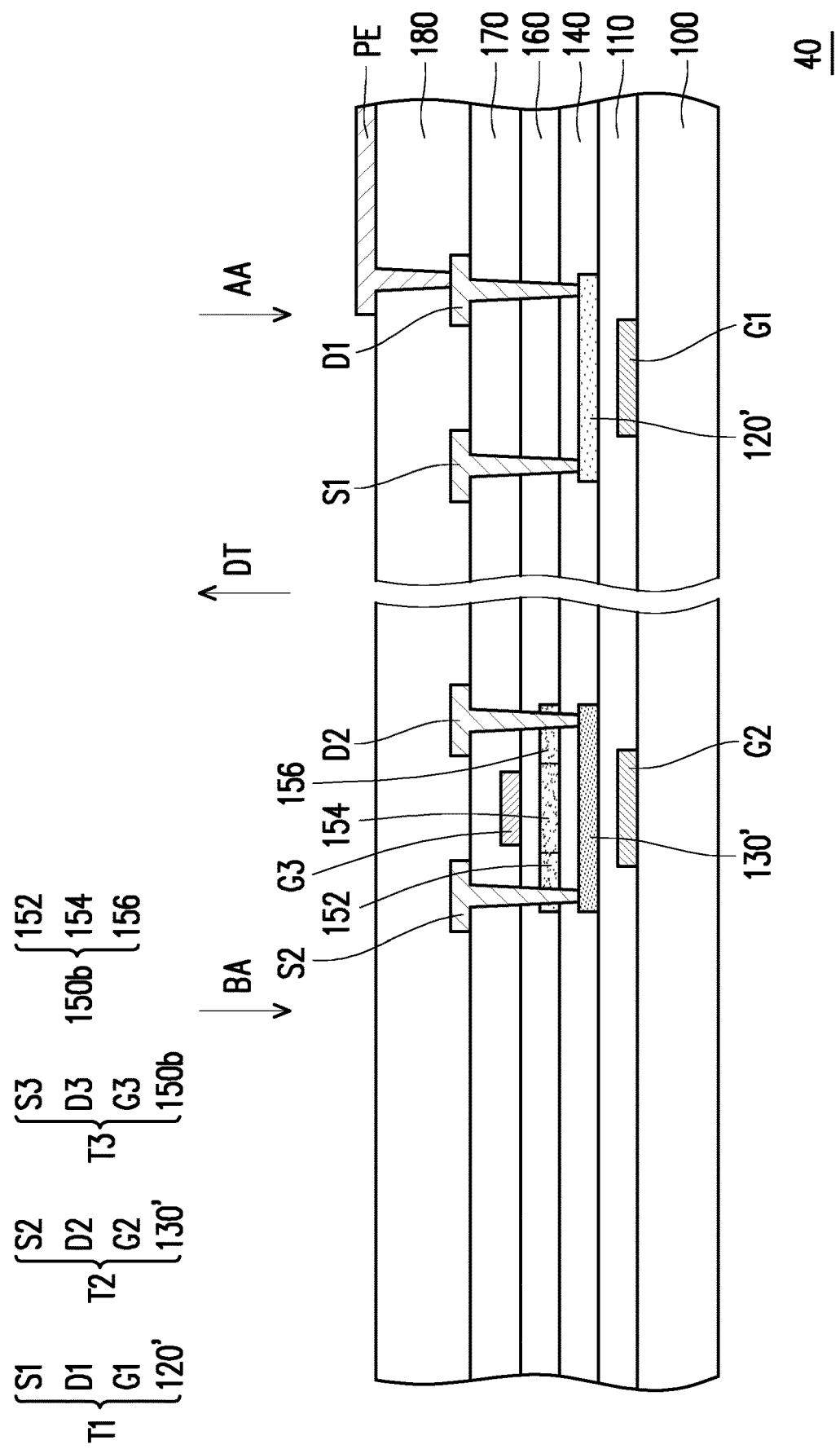
FIG. 5 is a cross section of an active device substrate according to an embodiment of the invention.

FIG. 5 is a cross section of an active device substrate according to an embodiment of the invention. It should be mentioned here that, the embodiment of FIG. 5 adopts the reference numerals of the embodiment of FIG. 4 and a portion of the contents thereof, wherein the same or similar numerals are used to represent the same or similar devices and descriptions of the same technical contents are omitted. The omitted portions are as described in the above embodiments and are not repeated herein.

The difference between an active device substrate 40 of the embodiment of FIG. 5 and the active device substrate 30 of the embodiment of FIG. 4 is that in the active device substrate 40, the silicon semiconductor layer 150b is located between the second crystallized metal oxide layer 130' and the third gate G3.

In some embodiments, the circuit diagrams of the second active device T2 and the third active device T3 are similar to the circuit diagrams of the second active device T2 and the third active device T3 in the embodiment of FIG. 4. In other words, the second source S2 or the second drain D2 is electrically connected to the second crystallized metal oxide layer 130' of the second active device T2 and the silicon semiconductor layer 150b of the third active device T3, but the invention is not limited thereto. One of the second source S2 and the second drain D2 is electrically connected to the silicon semiconductor layer 150b, and one of the third source S3 and the third drain D3 is electrically connected to the second crystallized metal oxide layer 130'. For instance, one of the second source S2 and the second drain D2 is electrically connected to one of the third source S3 (blocked by the second source S2 in FIG. 5) and the third drain D3 (blocked by the second drain S2 in FIG. 5).

In the present embodiment, the silicon semiconductor layer 150b and the second crystallized metal oxide layer 130' are overlapped in the direction DT perpendicular to the substrate 100. In some embodiments, when the second metal oxide layer is converted into the second crystallized metal oxide layer 130' in the second laser process, amorphous silicon in the silicon layer on the second crystallized metal oxide layer 130' is converted into polycrystalline silicon, and therefore the cost of the third laser process can be reduced.

In the present embodiment, the second active device T2 and the third active device T3 located in the peripheral region BA are overlapped, and therefore the border width of the active device substrate can be reduced.

Figure 6:
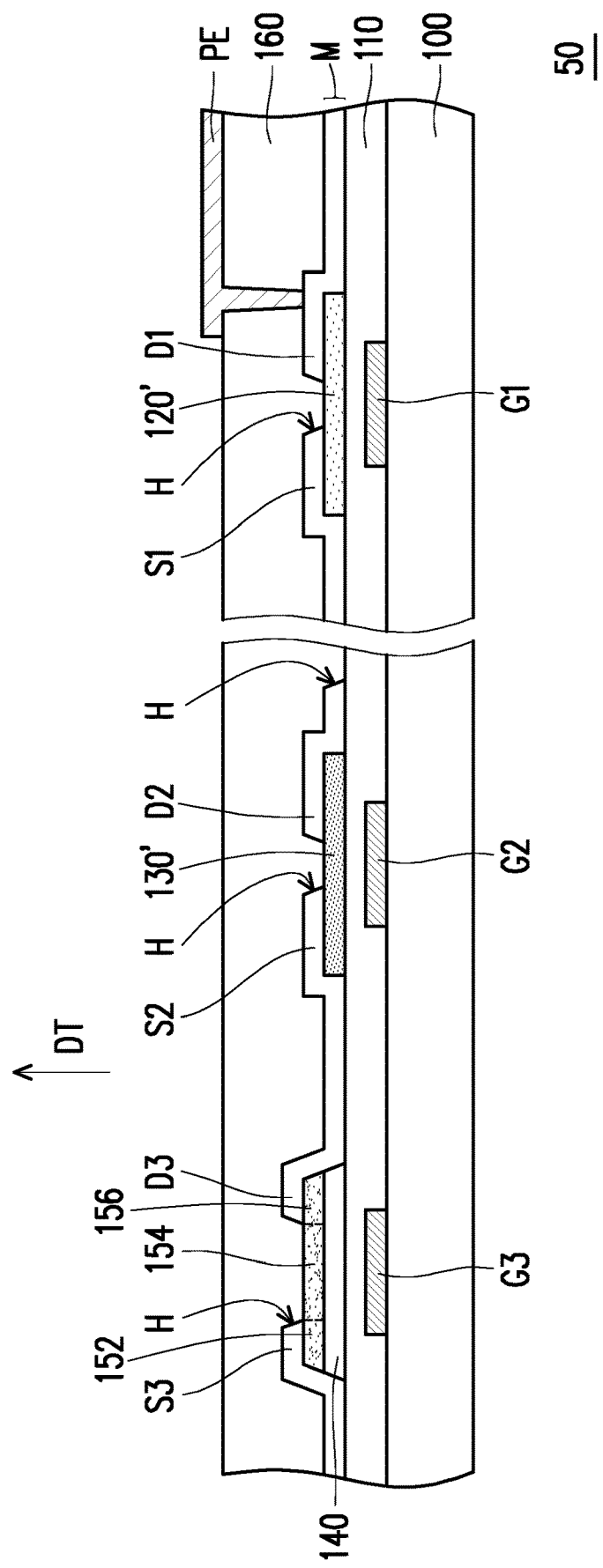
FIG. 6 is a cross section of an active device substrate according to an embodiment of the invention.

FIG. 6 is a cross section of an active device substrate according to an embodiment of the invention. It should be mentioned here that, the embodiment of FIG. 6 adopts the reference numerals of the embodiment of FIG. 4 and a portion of the contents thereof, wherein the same or similar numerals are used to represent the same or similar devices and descriptions of the same technical contents are omitted. The omitted portions are as described in the above embodiments and are not repeated herein.

The difference between an active device substrate 50 of the embodiment of FIG. 6 and the active device substrate 30 of the embodiment of FIG. 4 is that in the active device substrate 50, the third gate G3 is located between the first insulation layer 110 and the substrate 100.

In the present embodiment, before the first insulation layer 110 is formed, the first gate G1, the second gate G2, and the third gate G3 are formed. The first gate G1, the second gate G2, and the third gate G3 are, for instance, formed in the same process.

In the present embodiment, the second insulation layer 140 located on the first crystallized metal oxide layer 120' and the second crystallized metal oxide layer 130' is removed, and a portion of the second insulation layer 140 located between the silicon semiconductor layer 150b and the first insulation layer 110 is left.

The first source S1, the first drain D1, the second source S2, the second drain D2, the third source S3, and the third drain D3 are formed. The method of forming the first source S1, the first drain D1, the second source S2, the second drain D2, the third source S3, and the third drain D3 includes, for instance, first depositing an entire conductive layer M and then patterning the conductive layer M to form a plurality of openings H.

In some embodiments, the crystallized metal oxide layer has better anti-etching ability than the amorphous metal oxide layer, and therefore damage caused by an etchant to the first crystallized metal oxide layer 120' and the second crystallized metal oxide layer 130' when the conductive layer M is patterned can be reduced. In some embodiments, oxalic acid, aluminate, hydrofluoric acid, or other similar etchants is used in the patterning of the conductive layer M. In some embodiments, the conductive layer M adopts a molybdenum-aluminum-molybdenum multilayer structure having lower resistance and lower manufacturing cost, and aluminate etchant can be used when the conductive layer M is patterned to further reduce manufacturing cost.

In at least one embodiment of the invention, the cost for forming different crystallized metal oxide layers can be reduced. In at least one embodiment of the invention, the leakage current issue of the active device substrate can be alleviated. In at least one embodiment of the invention, the current efficiency of the active device substrate can be increased. In at least one embodiment of the invention, the border width of the active device substrate can be reduced.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a crystallized metal oxide layer, comprising:
   providing a substrate;
   forming a first insulation layer on the substrate;
   forming a first metal oxide layer on the first insulation layer;
   forming a second metal oxide layer on the first insulation layer;
   forming a second insulation layer on the first metal oxide layer and the second metal oxide layer, wherein the first metal oxide layer and the second metal oxide layer are located between the first insulation layer and the second insulation layer;
   forming a silicon layer on the second insulation layer, wherein the silicon layer covers the first metal oxide layer and the second metal oxide layer;
   performing a first laser process on a portion of the silicon layer covering the first metal oxide layer to convert the first metal oxide layer into a first crystallized metal oxide layer; and
   performing a second laser process on a portion of the silicon layer covering the second metal oxide layer to convert the second metal oxide layer into a second crystallized metal oxide layer.

2. The manufacturing method of the crystallized metal oxide layer of claim 1, wherein the first crystallized metal oxide layer comprises an indium element, a gallium element, a zinc element, and an oxygen element, and the second crystallized metal oxide layer comprises an indium element, a gallium element, a tin element, and an oxygen element.

3. The manufacturing method of the crystallized metal oxide layer of claim 1, wherein a material of the first insulation layer and the second insulation layer comprises silicon oxide.

4. A manufacturing method of an active device substrate, comprising:

forming a first crystallized metal oxide layer and a second crystallized metal oxide layer, wherein a method of forming the first crystallized metal oxide layer and the second crystallized metal oxide layer is provided in claim 1;

forming a first gate and a second gate on the substrate;

removing a portion of the silicon layer covering the first crystallized metal oxide layer;

forming a first source, a second source, a first drain, and a second drain, wherein the first source and the first drain are electrically connected to the first crystallized metal oxide layer, and the second source and the second drain are electrically connected to the second crystallized metal oxide layer.

5. The manufacturing method of the active device substrate of claim 4, further comprising removing a portion of the silicon layer covering the second crystallized metal oxide layer.

6. The manufacturing method of the active device substrate of claim 4, wherein after performing the first laser process, the portion of the silicon layer covering the first crystallized metal oxide layer comprises polycrystalline silicon, and after performing the second laser process, the portion of the silicon layer covering the second crystallized metal oxide layer comprises polycrystalline silicon.

7. The manufacturing method of the active device substrate of claim 4, further comprising:

forming a third insulation layer on the second insulation layer;

forming a third gate on the third insulation layer;

forming a P-type doped silicon semiconductor layer in another portion of the silicon layer, wherein the silicon semiconductor layer is located between the second crystallized metal oxide layer and the third gate;

forming a third source and a third drain, wherein the third source and the third drain are electrically connected to the silicon semiconductor layer, and the second source or the second drain is electrically connected to the silicon semiconductor layer.

8. The manufacturing method of the active device substrate of claim 7, further comprising, before forming the P-type doped silicon semiconductor layer in the another portion of the silicon layer:

performing a third laser process on the silicon layer such that the another portion of the silicon layer comprises polycrystalline silicon.

9. The manufacturing method of the active device substrate of claim 4, further comprising:

forming a third gate, wherein the third gate is located on the substrate;

forming a P-type doped silicon semiconductor layer in another portion of the silicon layer, wherein the silicon semiconductor layer, the first crystallized metal oxide layer, and the second crystallized metal oxide layer are not overlapped in a direction perpendicular to the substrate;

forming a third source and a third drain, wherein the third source and the third drain are electrically connected to the silicon semiconductor layer, and the third source or the third drain is electrically connected to the second crystallized metal oxide layer, wherein the third gate and the silicon semiconductor layer are overlapped in the direction perpendicular to the substrate.

10. The manufacturing method of the active device substrate of claim 9, comprising forming the first gate, the second gate, and the third gate before forming the P-type doped silicon semiconductor layer in the another portion of the silicon layer.

11. The manufacturing method of the active device substrate of claim 9, further comprising, before forming the P-type doped silicon semiconductor layer in the another portion of the silicon layer:

performing a third laser process on the silicon layer such that the silicon layer comprises polycrystalline silicon.

12. The manufacturing method of the active device substrate of claim 4, comprising forming the first gate and the second gate on the substrate before forming the first insulation layer on the substrate.

* * * * *